United States Patent [19]

Kirchoff

[11] 4,058,764

[45] Nov. 15, 1977

[54] COMBINED PILOT LIGHT AND GROUND TESTING ASSEMBLY

[75] Inventor: Francis D. Kirchoff, Waban, Mass.

[73] Assignee: Alco Electronic Products, Inc., North Andover, Mass.

[21] Appl. No.: 703,575

[22] Filed: July 8, 1976

[51] Int. Cl.² .......................................... G01R 31/02
[52] U.S. Cl. .................... 324/51; 340/252 R
[58] Field of Search ............... 324/51, 66, 156, 122, 324/133; 340/255, 252 R, 252 P, 251, 366 R (U.S. only); 339/113 L

[56] References Cited

U.S. PATENT DOCUMENTS

| | | | |
|---|---|---|---|
| 3,090,949 | 5/1963 | Hallerberg | 340/252 R X |
| 3,286,255 | 11/1966 | Sanchez | 340/252 R X |
| 3,383,588 | 5/1968 | Stoll et al. | 324/51 |
| 3,530,337 | 9/1970 | Moore | 340/252 R X |
| 3,559,200 | 1/1971 | Walters | 324/51 X |
| 3,793,563 | 2/1974 | Brefka | 324/156 X |
| 3,967,195 | 6/1976 | Averitt et al. | 324/51 |
| 3,984,765 | 10/1976 | Rocci | 324/51 |

FOREIGN PATENT DOCUMENTS

| | | | |
|---|---|---|---|
| 1,176,983 | 10/1970 | United Kingdom | 324/51 |
| 1,261,518 | 1/1972 | United Kingdom | 324/51 |

Primary Examiner—Gerard R. Strecker
Attorney, Agent, or Firm—Pearson & Pearson

[57] ABSTRACT

A combined pilot light and ground testing assembly for conventional 120 volt A.C. circuits is secured in the front panel of an electric console, secured to the male A.C. plug at the end of a cable, or secured to other appropriate equipment. It includes a pair of lamp chambers spaced from a third lamp in rectilinear alignment. When both of the juxtaposed pair of chambers are lit as a dual pilot light a perfect condition exists. Any other combination of lighted lamp chambers indicates an unsafe condition in the circuitry.

4 Claims, 15 Drawing Figures

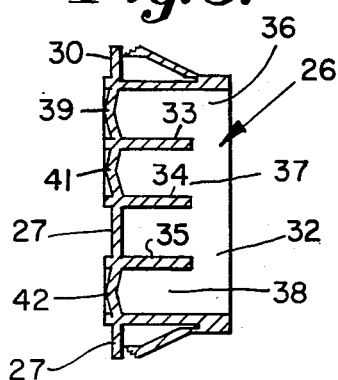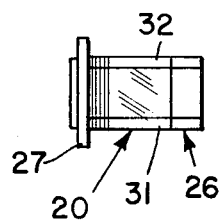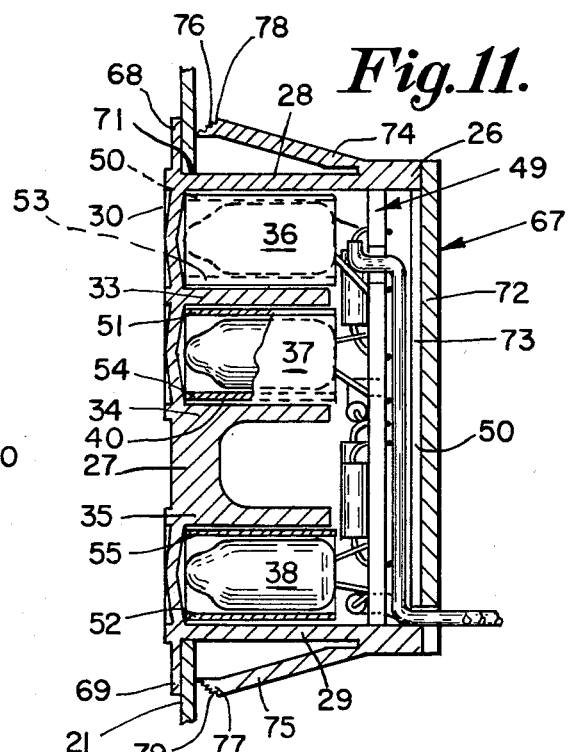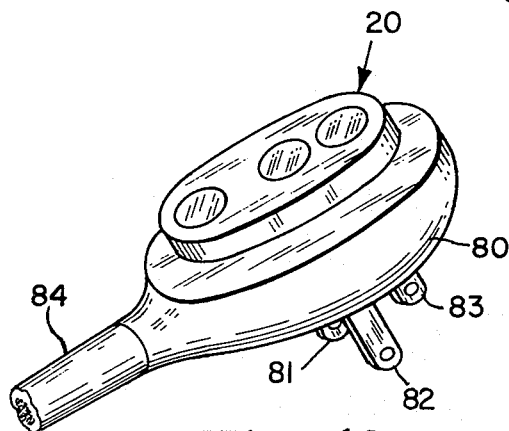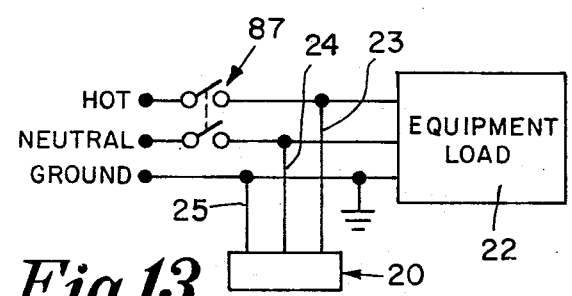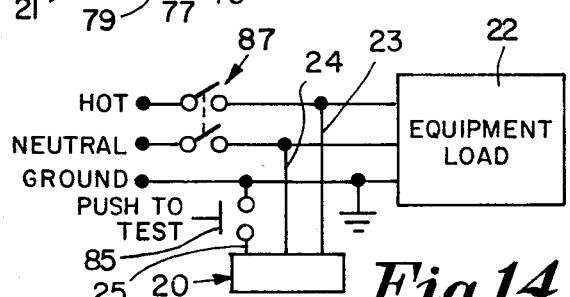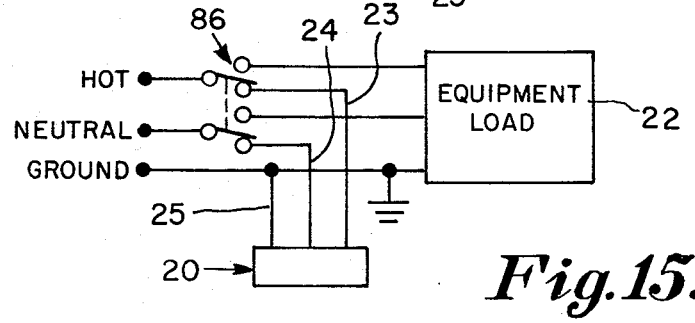

COMBINED PILOT LIGHT AND GROUND TESTING ASSEMBLY

BACKGROUND OF THE INVENTION

It has heretofore been proposed in U.S. Pat. No. 3,317,825 to Huff of May 2, 1967 and in U.S. Pat. No. 3,383,588 to Stoll of May 14, 1968 to provide a portable, three prong, circuit tester for electric sockets in which three lamps are triangularly arranged in side by side chambers.

In U.S. Pat. No. 2,598,775 to Fischer of June 3, 1952, a similar portable ground tester is disclosed in which the three test lamps are rectilinearly arranged in side by side relationship.

SUMMARY OF THE INVENTION

In this invention, a ground tester is disclosed in which a molded casing in permanently affixed to an electric apparatus having power, neutral and ground conductors, for example to the front panel of an electric console, or to a male electric plug at the end of a cable. The ground tester has three rectilinearly aligned chambers, each with a lamp therein, but two of the chambers are juxtaposed, and side by side to indicate a perfect circuit when energized and to serve as a pilot light. The third chamber is spaced from the dual, or pair of, chambers so that when it is energized, or when any lamps other than the pair only, are energized, an unsafe condition is indicated.

BRIEF DESCRIPTION OF THE DRAWING

FIG. 9 is a side elevation of the molded case in half section;

FIG. 10 is a top plan view of the molded case;

FIG. 11 is a side elevation in section of the tester;

FIG. 12 is a perspective view showing the tester of the invention secured to a male plug at the end of a cable;

FIG. 13 is a circuit diagram of a normal installation; and

FIGS. 14 and 15 are circuit diagrams of alternative installations.

DESCRIPTION OF A PREFERRED EMBODIMENT

Figure 1:
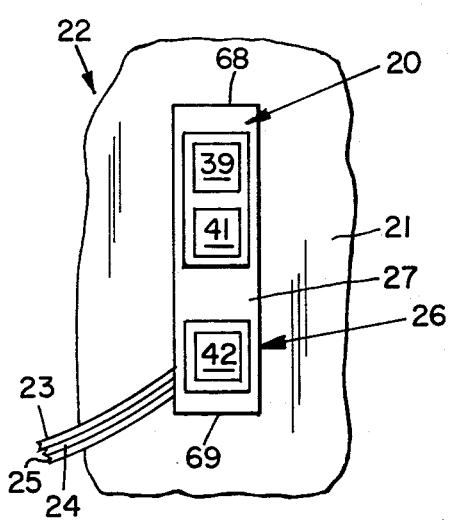
FIG. 1 is a front elevation of the ground tester of the invention secured to a front panel to serve as a pilot light.
Figure 2:
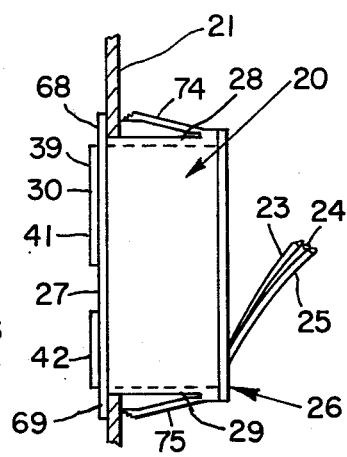
FIG. 2 is a side elevation thereof.
Figure 3:
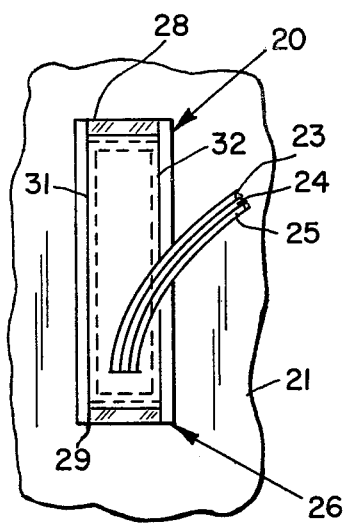
FIG. 3 is a rear elevation thereof.
Figure 4:
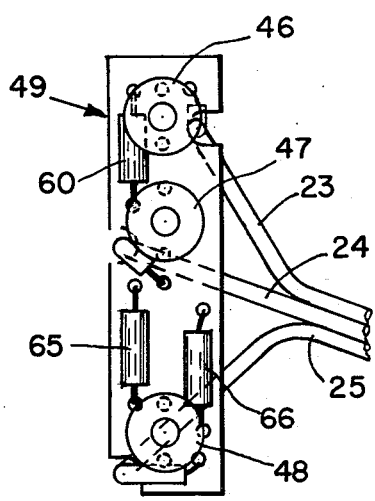
FIG. 4 is a front elevation.

As shown in FIGS. 1-11, in a combined pilot light and ground testing assembly 20 of the invention is secured, or affixed permanently to the front panel 21, or to some other suitable panel of an electric apparatus 22 having the usual power conductor 23, neutral conductor 24 and ground conductor 25.

Testing assembly 20 includes a molded case 26, of plastic or the like, having integral, unitary front wall 27, top wall 28, bottom wall 29, and opposite side walls 31 and 32. The elongated molded case 26 also includes a plurality of transverse, integral partitions 33, 34 and 35 which form a pair of juxtaposed, side by side lamp chambers 36 and 37, longitudinally spaced a substantial distance apart from the third lamp chamber 38 but rectilinearly aligned therewith. The front wall of each chamber is formed by a concave-convex, radially grooved, or fluted, lens such as at 39, 41 and 42, and there is a visual signalling, electrically energizable element 43, 44, or 45 such as a neon lamp, in each chamber.

Figure 5:
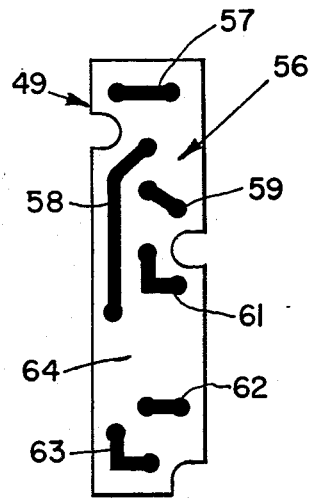
FIG. 5 is a rear elevation of the circuit board.
Figure 6:
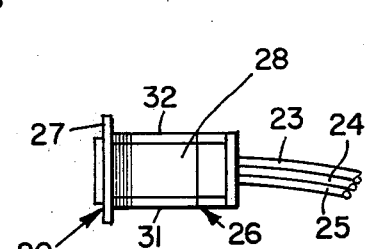
FIG. 6 is a top plan view of the tester.
Figure 7:
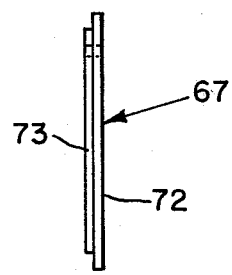
FIG. 7 is a side elevation of the cover means
Figure 8:
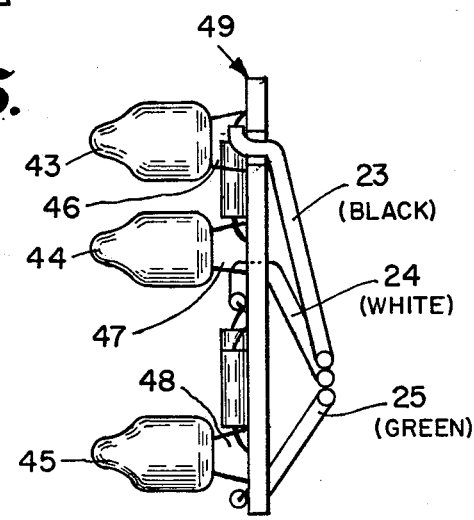
FIG. 8 ;is a side elevation of the circuit board.

The neon lamps 43, 44 and 45 are mounted by suitable terminals 46, 47 and 48 in the elongated circuit board 49, as best shown in FIGS. 5, 8 and 11, and are preferably of the high intensity type. Because the molded case 26, its front, top and bottom walls and partitions are of transparent plastic 30, to permit passage of light through the lenses 39, 41 and 42, a cylindrical sleeve 50, 51 or 52, of opaque, plastic tubing 40 lines each chamber 36, 37 or 38 to shield each chamber from the other as at 53, 54 and 55.

The circuit board 49 of the combined pilot light and ground testing assembly 20 is connected to the appropriate conductors of the apparatus 22 by the hot, or power, conductor 23 (black), the neutral conductor 24 (white) and the ground conductor 25 (green) or other suitable conductors. A printed circuit 56, having conductors 57, 58, 59, 61, 62 and 63, on the rear face 64 of the board together with resistors 60, 65 and 66 on the front face of the board, completes the circuitry in a manner well known and similar to that shown and described in U.S. Pat. No. 3,383,588 to Stoll in FIG. 10, thereof, or in FIGS. 1-5 of U.S. Pat. No. 3,317,825 to Huff, both mentioned above. As in U.S. Pat. No. 3,383,588, when the two lamps 22 and 23 are lit, correct wiring is indicated, and as in U.S. Pat. No. 3,317,825 when lamps 1 and 2 are lit correct wiring is indicated, in the tester of this invention, when juxtaposed lamps 43 and 44 are lit, correct wiring is indicated and any other combination of lamps indicates an unsafe condition.

The partitions 33, 34 and 35 are of less depth than the depth of the walls 28, 29, 31 and 32 to form a circuit board compartment 50 at the rear of the hollow insulating case 26. The elongated circuit board 49, as shown in FIG. 11 is located in the circuit board compartment 50 between the transverse partitions 33, 34 and 35 and cover means 67, within the molded case 26. The case 26 includes an integral upper extension 68 to front wall 27 and an integral lower extension 69 to front wall 27 to prevent fall through of the assembly 20 on the aperture 71 in the front panel 21.

Cover means 67 includes the rear wall 72, with a flange 73 fitting within the rear opening of the case 26 to form a press fit closure therefore. Preferably molded case 26 also includes an upper, integral, resilient prong 74 and a lower integral resilient prong 75, for insertion of the case in aperture 71 to then snap outwardly so that the free tips 76 and 77 lock against the rear face of panel 21. If desired the prongs 74 and 75 may be integral with cover means 67 rather than with case 26. Preferably the tips 76 and 77 are serrated as shown at 78 and 79 for a more firm frictional grip.

As shown in FIG. 12 the combined pilot light and ground testing assembly 20 may be permanently affixed to a male plug 80, having the usual blades 81, 82 and 83, and carried at the end of cable 84. The assembly 20 is provided with rounded edges and may be molded integrally with the male plug 80 of rubber, plastic or the like or may be affixed to the plug by suitable screws.

In FIG. 13 a circuit diagram of a normal installation is shown in which the tester 20 acts as a pilot light and line fault monitor when the electric equipment 22 is operating with off-on switch 79 closed.

An alternative installation is shown in FIG. 14 wherein the tester 20 acts as a pilot light and functions as a ground fault tester when momentary push button switch 80 is pressed.

Another alternative installation is shown in FIG. 15 wherein the tester 20 acts as line fault tester when the apparatus 22 is plugged into an A.C. receptacle and the power switch 81 is off. When power switch 81 is turned on, the equipment 22 is connected to the line and the tester 20 is disabled.

I claim:

1. A circuit tester for checking a standard grounded three wire electrical outlet to determine if said outlet is properly wired:

said circuit tester being of the type having a hollow, insulating case with a front wall, a pair of side walls, a top wall, a bottom wall, a rear opening and integral partitions extending from front to rear across the interior thereof to form three rectilinearly aligned chambers therewithin;

said tester being characterized by:

said hollow case being of one piece of translucent plastic with three said partitions spaced apart therein to form a pair of juxtaposed said chambers and a third said chamber at a spaced distance therefrom;

said partitions being of less depth than the depth of the said walls of said case to provide a circuit board compartment at the rear of said case;

a circuit board located in said circuit board compartment, said board supporting a pair of juxtaposed lamps, and a third lamp spaced apart therefrom, each said lamp being enclosed within one of said chambers and electrically connected, through said circuit board to a three prong connection in said outlet;

a sleeve of opaque material lining each said chamber to light shield one said chamber from another;

and a rear wall forming a closure to the rear opening of said case.

2. A circuit tester as specified in claim 1 wherein:

said molded plastic case of translucent material includes three integral concave-convex lenses each forming the front wall of one of said chambers.

3. A circuit tester as specified in claim 1 wherein:

said front wall of said molded case includes an upper integral extension and a lower integral extension;

and said top and bottom walls of said molded case each include an integral, resilient, snap prong extending forwardly and outwardly from the rear thereof;

said extensions and prongs cooperating to mount said case in an aperture in a panel of an electric console.

4. A circuit tester as specified in claim 1 wherein:

each said prong includes an outer face with a series of spaced integral serrations thereon.

* * * * *